(12) United States Patent
Kamins

(10) Patent No.: US 8,927,346 B2
(45) Date of Patent: Jan. 6, 2015

(54) ELECTRICALLY AND/OR THERMALLY ACTUATED DEVICE

(75) Inventor: Theodore I Kamins, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 602 days.

(21) Appl. No.: 13/121,916

(22) PCT Filed: Dec. 31, 2008

(86) PCT No.: PCT/US2008/088642
§ 371 (c)(1),
(2), (4) Date: Mar. 30, 2011

(87) PCT Pub. No.: WO2010/077247
PCT Pub. Date: Jul. 8, 2010

(65) Prior Publication Data
US 2011/0181318 A1     Jul. 28, 2011

(51) Int. Cl.
*H01L 21/77*     (2006.01)
*H01L 27/10*     (2006.01)
*H01L 49/02*     (2006.01)

(52) U.S. Cl.
CPC ............... *H01L 27/10* (2013.01); *H01L 28/84* (2013.01)
USPC ................... 438/128; 257/309; 257/E21.012; 257/E21.013; 438/665; 438/669

(58) Field of Classification Search
None
See application file for complete search history.

(56) References Cited

U.S. PATENT DOCUMENTS

| | | | |
|---|---|---|---|
| 6,649,957 B2 | 11/2003 | Hsu et al. | |
| 7,078,275 B2* | 7/2006 | Hiroshima et al. | 438/150 |
| 2004/0058491 A1* | 3/2004 | Basceri et al. | 438/239 |
| 2005/0001227 A1* | 1/2005 | Niki et al. | 257/98 |
| 2006/0097238 A1 | 5/2006 | Breuil et al. | |
| 2007/0147109 A1 | 6/2007 | Kim | |
| 2008/0079029 A1* | 4/2008 | Williams | 257/213 |
| 2008/0090337 A1* | 4/2008 | Williams | 438/133 |
| 2008/0203377 A1* | 8/2008 | Choi et al. | 257/5 |

FOREIGN PATENT DOCUMENTS

JP     2002-203915 A     7/2002

OTHER PUBLICATIONS

Yang. J. J et al , "Memristive switching mechanism for metal/oxide/metla nanodevices" Nature Nanotechnology, Jul. 2008, V 3, pp. 429-433.

* cited by examiner

*Primary Examiner* — Matthew W Such
*Assistant Examiner* — Abul Kalam
(74) *Attorney, Agent, or Firm* — Dierker & Associates; Julia Dierker

(57) ABSTRACT

An electrically, thermally, or electrically and thermally actuated device is disclosed herein. The device includes a substrate, a first electrode established on the substrate, an active region established on the electrode, and a second electrode established on the active region. A pattern is defined in at least one of the substrate, the first electrode, the second electrode, or the active region. At least one of grain boundaries are formed within, or surface asperities are formed on, at least one of the electrodes or the active region. The pattern controls the at least one of the grain boundaries or surface asperities.

16 Claims, 3 Drawing Sheets

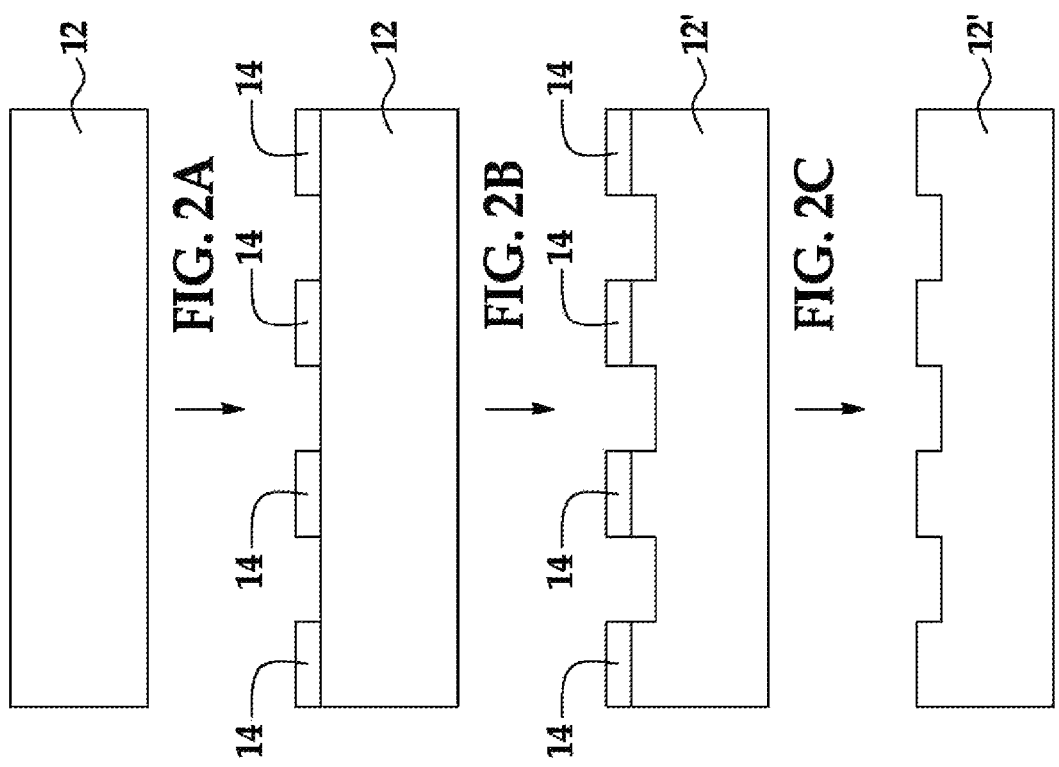

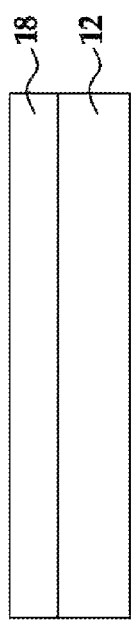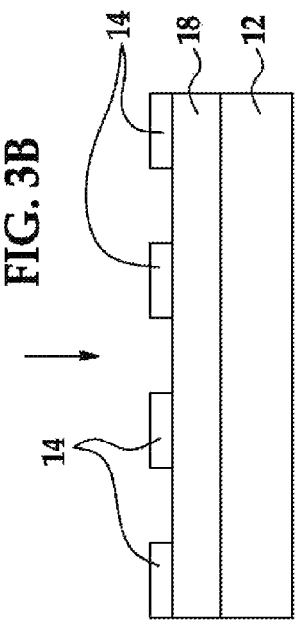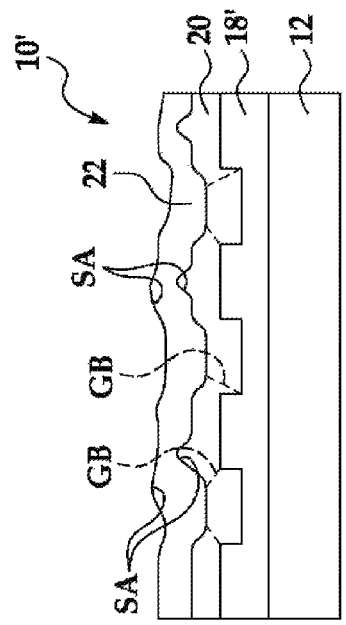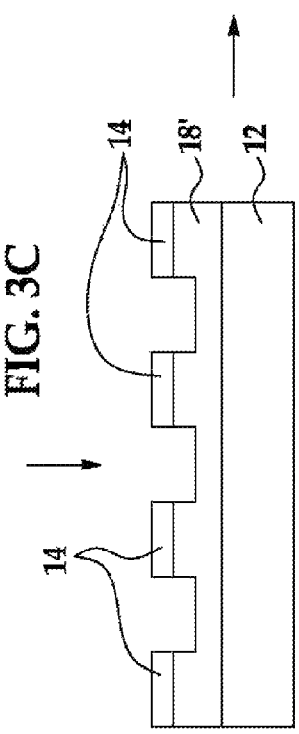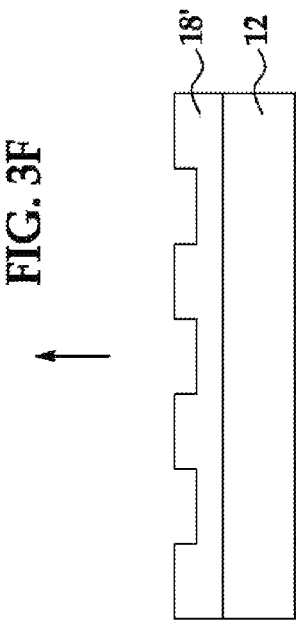

ELECTRICALLY AND/OR THERMALLY ACTUATED DEVICE

BACKGROUND

The present disclosure relates generally to electrically, thermally, or electrically and thermally actuated devices. Also disclosed herein are arrays incorporating such devices, and methods for controlling grain, boundaries and/or surface asperities in such devices.

Nanometer-scale crossed-wire switching devices have previously been reported that could be switched reversibly and had an ON-to-OFF conductance ratio of up to about $10^3$. Such devices have been used to construct crossbar circuits and provide a promising route for the creation of ultra-high density nonvolatile memory. A latch (which is an important component for logic circuits and for communication between logic and memory) has been fabricated from a series connection of crossed-wire switches. New logic families, constructed entirely from crossbar arrays of switches or as hybrid structures composed of switches and transistors, have also been described. These new logic families have the potential to dramatically increase the computing efficiency of CMOS circuits.

BRIEF DESCRIPTION OF THE DRAWINGS

Features and advantages of embodiments of the present disclosure will become apparent by reference to the following detailed description and drawings, in which like reference numerals correspond to the same or similar, though perhaps not identical, components. For the sake of brevity, reference numerals having a previously described function may or may not be described in connection with subsequent drawings in which they appear.

FIGS. 2A through 2F together depict a schematic flow, diagram of an embodiment of a method of controlling grain boundaries and/or surface asperities in a device;

FIGS. 3A through 3F together depict a schematic flow diagram of another embodiment of controlling grain boundaries and/or surface asperities in a device;

DETAILED DESCRIPTION

Figure 1A:
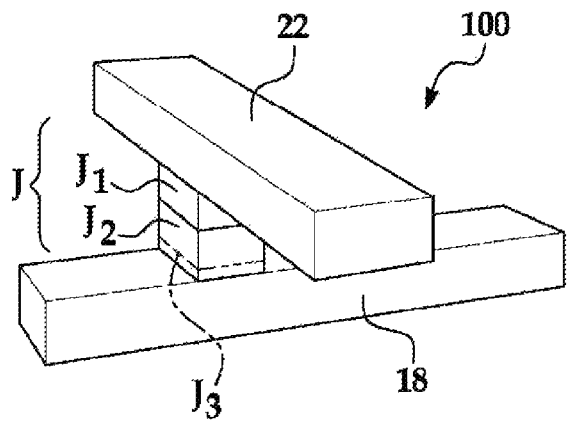
FIG. 1A is a perspective view of an embodiment of a solid-state electrically actuated switch connecting two different crossed wires.

Embodiments of the device disclosed herein include an active region located between two wires/electrodes. Contact regions between the metal electrodes and the semiconductor active region resemble Schottky barriers. It is believed that switching of such solid-state electrically and/or thermally actuated devices depends at least in part on the grain boundaries and/or surface roughness of the electrodes and/or active regions. VARIOUS switching mechanisms are believed to initiate switching in such devices. One switching mechanism involves the diffusion of dopants along grain boundaries through the electrode(s) and/or the active region. For example dopants, such as oxygen vacancies diffuse along grain boundaries through a platinum electrode and/or a titanium dioxide active region adjacent the platinum electrode. Another switching mechanism involves switching being initiated by a high electric field in the active region at asperities on the adjacent electrode. For example, a high electric field is believed to exist in a titanium dioxide active region at asperities on an adjacent platinum electrode.

The embodiments of the method disclosed herein advantageously provide control over the formation of grain boundaries and/or surface asperities in one or more components of nanoscale devices. As a result, diffusion or field enhancement of the device may be achieved. It is believed that surface asperities contribute to the enhanced field, and that grain boundaries contribute to the enhanced diffusion. The method (s) disclosed herein also enable grain boundaries and/or surface asperities to be formed with uniformity from one device to the next. As such, an array of devices may be formed where each device exhibits consistent/uniform characteristics and switching characteristics as the other devices in the array.

As used herein, nanometer scale dimensions refer to dimensions that range from 0.5 nanometers to 100 nanometers (0.10 micrometers).

"Surface asperities" include irregularities and/or roughness at a component's surface. The location and density of the surface asperities may be controlled by selecting a desirable pattern to be etched into at least one component of the device. For convenience of discussion in this application, surface irregularities formed by the etching process used to form a particular pattern are included in the term surface asperities.

The term "defined", as it is used herein, means that a pattern is directly etched (or otherwise formed) into the device component, or that the pattern is replicated in a component established directly or indirectly (i.e., has one or more layers therebetween) on a patterned component. When the pattern is etched or otherwise formed into a device component, the phrase "directly defined" may be utilized to describe such pattern. When the pattern is defined via replication, it is to be understood that the replicated pattern may not exactly correspond to the originally formed pattern. As a non-limiting example, when the pattern is directly defined in the first electrode, the pattern is directly etched or otherwise formed in an exposed surface of the first electrode. In such instances, any pattern defined in subsequently deposited components (e.g., the active region or second electrode) is replicated by virtue of such deposition on the patterned component. As another non-limiting example, when the pattern is directly defined in the substrate, it is to be understood that the pattern is directly etched or otherwise formed in an exposed surface of the substrate, and then the same pattern may be defined in the subsequently deposited first electrode, active region, and second electrode virtue of being replicated during deposition of such components.

Figure 1B:
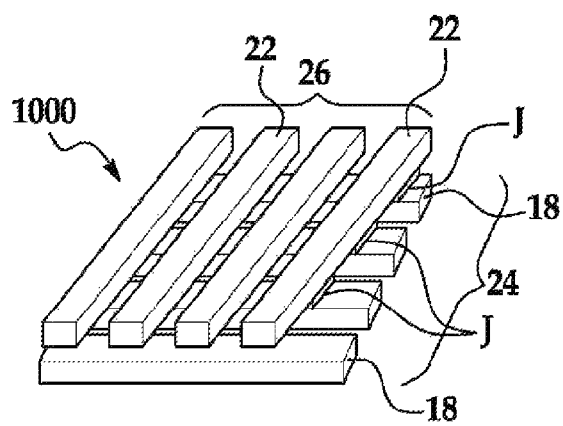
FIG. 1B is a perspective view showing an array of the switches of FIG. 1A, also known as a crossbar.

Referring now to FIGS. 1A and 1B, a known solid-state electrically actuated switch 100 and a known cross-bar array 1000 are depicted. In FIG. 1A, two different crossed wires or electrodes 18, 22 have a switch junction J therebetween. The switch junction J includes a primary active region $J_1$ and a secondary active region $J_2$. In one embodiment, the primary active region $J_1$ is a material that is both an electronically semiconducting and a weak ionic conductor (discussed further hereinbelow) that can be doped with electron donors as interstitials, vacancies, or impurities. In another embodiment, the material of the primary active region $J_1$ is both nominally electrically insulating and a weak ionic conductor. The secondary active region $J_2$ is a material that acts as a source and sink of the doping species. As shown in FIG. 1A, the switch junction J may also include the molecular layer $J_3$ at the interface between the secondary active region $J_2$ and the electrode 18 or the interface between the primary active region $J_1$ and the electrode 22 where the molecular layer $J_3$ includes molecules that may or may not be switchable. One or both wires 18, 22 may be metal or semiconductor materials. It is to be understood that when both electrode/wires 18, 22 are semiconductors, series resistance may limit the size and behavior of an array in which such wires 18, 22 are included. In some instances, it is desirable that both wires 18, 22 are metal.

A crossbar array 1000 may also be formed including a plurality of the solid-state electrically actuated switches 100 shown in FIG. 1A. As shown in FIG. 1B, a first layer 24 of approximately parallel wires 18 is overlain by a second layer 26 of approximately parallel wires 22. The second layer 26 is shown as roughly perpendicular, in orientation, to the wires 18 of the first layer 24. It is to be understood, however, that the orientation angle between the layers 24, 26 may vary. The two layers 24, 26 of wires 18, 22 form a lattice, or crossbar. Each wire 22 of the second layer 26 overlies all of the wires 18 of the first layer 24, and comes into close contact with each wire 18 of the first layer 24 at wire intersections that represent the closest contact between two wires 18, 22. The switch junction J is shown disposed between wires 18, 22. While three such switch junctions J are shown, it is to be understood that a switch junction J is formed at each intersection of a wire 18 with a wire 22. Such crossbars 1000 may be fabricated from micron-, submicron- or nanoscale-wires, depending on the application.

Although individual wires/electrodes 18, 22 in the figures are shown with square or rectangular cross-sections, electrodes 18, 22 may also have circular, elliptical, or more complex cross-sections. The electrodes 18, 22 may also have many different widths or diameters and aspect ratios or eccentricities.

As is well known, such switches may be used as the basis for memories (e.g., the storage of a bit of information, 1 or 0), as either a closed or open switch in a cross-point memory, for configuration bits in a logic circuit that resembles a Field Programmable Gate Array, or as the basis for a wired-logic Programmable Logic Array. These switches also find uses in a wide variety of other applications.

Referring now to FIGS. 2A through 2F, an embodiment of the method for controlling grain boundaries and/or surface asperities in a device is depicted. Very generally, the method includes selecting a pattern to define in a substrate or an electrode of the device, and defining the selected pattern in the desirable component. It is to be understood that grain boundaries and/or surface asperities will form as a result of the pattern selected.

In FIG. 2A, a substrate 12 is depicted. Generally, the substrate 12 is an insulating substrate, such as silicon dioxide, silicon nitride, aluminum oxide, sapphire, glass, an insulating layer of one of the listed materials on a conducting or semiconducting substrate, or the like.

As shown in FIG. 2B, a mask material 14 is established on the substrate 12 in a manner sufficient to achieve a desirable pattern. More particularly, the mask material 14 is established so that portions of the substrate 12 that are to subsequently be etched remain exposed. The mask material 14 may be a self-assembled monolayer (SAM, a non-limiting example of which is an alkylsiloxane SAM), a Langmuir-Blodgett (LB) film, a block copolymer layer, a photoresist layer, an electron-beam resist layer, another organic resist layer, or the like. The establishment of the mask material 14 may be accomplished using standard techniques for the respective materials.

For the SAM, LB film, and block copolymer mask materials 14, the pattern will form spontaneously when known techniques applicable for the material are selected. It is to be understood, however, that the materials themselves are selected so that the resulting mask material 14 includes therein regions that protect the underlying surface and regions that allow attack of the underlying surface. In order to achieve such patterns, the materials selected are those that form a pattern having fine dimensions, or dimensions less than the underlying or overlying electrode width, such that at least one (but likely several or many) irregularities are etched into each substrate or electrode. More specifically, for a SAM, materials are selected which create periodicity in the SAM having period less than the underlying substrate or electrode width. For an LB film, molecules are selected which create periodicity in the LB film having period less than the underlying or overlying electrode width. For a resist layer, very fine nanoimprint lithography with period less than the width of the electrode adjacent to the pattern may be used. In order to decrease variability among several devices 10 in an array, it may be desirable to form at least several irregularities in the component underlying the mask material 14.

As one example, when a block copolymer is used, the two materials in the copolymer separate at the nanoscale and one of the materials is soluble and readily removable. As such, the block copolymer layer may be established on the entire substrate surface and then exposed to a particular solvent which dissolves the one material, thereby exposing portions of the substrate surface. The other non-dissolved material of the block copolymer forms the mask material 14 which protects the underlying substrate 12 during subsequent etching processes.

As another example, when an LB film is used as the mask material 14, molecules which will form the desirable protecting and attaching regions are dispersed on a liquid, which is compressed into a smaller area until a dense layer is formed. This dense layer is then transferred to the substrate 12.

When the mask material 14 is established in the desirable pattern, the structure is exposed to an etching process, as shown in FIG. 2C. The exposed portions of the surface of the substrate 12 are attacked during etching to remove a portion of the thickness of the substrate 12 or to create an irregular surface in these regions. It is generally desirable to select an etching process that will attack the exposed substrate 12, and will not attack the mask material 14 or will attack the mask material 14 at a slower rate. The chemistry of the etching process will depend, at least in part, on the materials selected for the substrate 12 and the mask material 14. Non-limiting examples of suitable etching processes include dry etching techniques, anisotropic etching (which results in sharp edges along the patterned surface), or isotropic etching.

After the substrate 12 is etched, the mask material 14 is removed. The resulting patterned substrate 12' is shown in FIG. 2D. The mask material 14 is generally dissolved in a suitable solvent that will not deleteriously affect the substrate 12. Selection of a suitable solvent will depend upon the mask and substrate materials used.

FIGS. 2E and 2F depict a plurality of layers established on the patterned substrate 12'. Such layers include an adhesion layer 16, a bottom electrode 18, an active region 20, and a top electrode 22. An embodiment of the resulting device 10, including all of the layers, is depicted in FIG. 2F.

In this example, the adhesion layer 16 is shown established directly on the patterned substrate 12'. Generally, the adhesion layer 16 enhances the bond between the patterned substrate 12' and the subsequently established bottom electrode 18. In some instances, the adhesion layer 16 may be a source of dopants for the active region 20, which diffuse through the bottom electrode 18 when exposed to certain conditions. Non-limiting examples of suitable materials for the adhesion layer include titanium or chromium. It is believed that in some instances, aluminum, magnesium, zinc, niobium, tantalum, manganese, vanadium, zirconium, or hafnium may also be used as the adhesion layer 16. The adhesion layer 16 may be established on the patterned substrate 12' via any suitable technique, such as, for example, sputtering, electron-beam evaporation, molecular beam deposition, chemical vapor deposition (CVD), or atomic layer deposition (ALD). It is to be understood that the adhesion layer 16 may be omitted in some embodiments.

The bottom electrode 18 is then established on the adhesion layer 16 or, in other embodiments, directly on the patterned substrate 12'. The bottom electrode 18 may be fabricated using conventional techniques, such as photolithography or electron beam lithography, or by more advanced techniques, such as imprint lithography. In one embodiment, the thickness of the bottom electrode 18 ranges from about 5 nm to about 30 nm. The bottom electrode 18 may be any suitable conductive or semiconducting material, such as gold, platinum, tungsten, copper, silicon, etc.

It is to be understood that the pattern in the substrate 12' is generally replicated in one or more subsequent layers deposited thereon. In some instances, as more layers are established, the pattern and its effects may become less prominent. For example, the top electrode 22 (shown in FIG. 2F) may not be appreciably patterned. In other instances, however, as more layers are established, the pattern and its effects may become accentuated. The pattern (in addition to other factors described hereinbelow) controls the location and density of grain boundaries GB and/or surface asperities SA in and/or on the subsequently established components (the grain boundaries GB and surface asperities SA are shown in FIGS. 2E and 2F). Additionally, in some instances, the pattern features make up the surface asperities SA.

When the pattern is formed in the substrate 12, 12', the bottom electrode 18 may have grain boundaries GB formed therein and/or surface asperities SA formed thereon. At least the density of such grain boundaries GB and/or surface asperities SA will depend, at least in part, on the period of the selected pattern. The formation of grain boundaries GB will also depend, at least in part on the detailed mechanism of nucleation. For example, if nucleation is favored near irregularities/steps, then grain boundaries GB will form when nuclei grow together (e.g., near center of flat regions). However, if nucleation is favored on flat surfaces, then grain boundaries GB will form near the irregularities/steps. While many variables contribute to the formation of grain boundaries GB and/or surface asperities SA (discussed further hereinbelow), generally a sharper etched pattern edge may favor the formation of grain boundaries GB, and a less sharp etched pattern edge may favor the formation of surface asperities SA.

The active region 20 is established on the bottom electrode 18. Generally, the active region 20 functions as a switching junction of the device 10, similar to switching junction J briefly described hereinabove. In the embodiments disclosed herein, the active region 20 is capable of transporting and hosting ions that act as dopants to control the flow of electrons through the device 10. The basic mode of operation of the device 10 is to apply an electrical field (the drift field, which may exceed some threshold for enabling the motion of the ions in the active region 20) across the device 10 large enough to cause mobile dopants to be transported within the active region 20 via ionic transport. The mobile dopants are generally an ionic species that change the electrical conductivity of the active region 20 from low conductivity (i.e. an undoped semiconductor or insulator—switch-OFF configuration) to high conductivity (doped to provide a higher conductivity—switch-ON configuration) or from high electrical conductivity to low conductivity (switch-ON to switch-OFF). As such, the reconfiguration of the dopant profile under electric field changes the electrical transport behavior of the junction.

The active region 20 is also a thin film (e.g., equal to or less than 500 nm) of a material that is electronically semiconducting or nominally electrically insulating and is a weak ionic conductor. It is to be understood that the definition of weak ionic conductor depends upon the application for which the device 10 is designed. Under most conditions, the mobility and the diffusion constant for a species in a lattice are directly proportional to one another, via the "Einstein relation". Thus, if the mobility of ionized species in a lattice is very high, so is the diffusion constant. In general, it is desired for a device 10 to stay in a particular state, ON or OFF, for an amount of time that may range from a fraction of a second to years, depending on the application. Thus, the diffusion constant for such a device 10 is, in an embodiment, low enough to ensure the desired level of stability, to avoid inadvertently turning the device 10 from ON, to OFF or vice versa via ionized species diffusion, rather than by intentionally setting the state of the device 10 with a voltage pulse. Therefore, a "weak ionic conductor" is one in which the ion mobility, and thus the diffusion constant, is small enough to ensure the stability of the ON or OFF state of the device 10 for as long as necessary under the desired conditions (e.g., the device 10 does not change state because of diffusion of the mobile dopants).

As such, the active region 20 material is selected such that the drift of the mobile dopants into or out of the active region 20 is possible, but not too facile. This generally ensures that the device 10 will remain in whatever state it is set for a reasonably long time. This also contributes to the device 10 being nonvolatile (i.e., it holds its state after the drift field has been removed). In some instances, the device 10 is a two-terminal device—applying a high bias to the device 10 causes both electron current and ion current to flow, whereas at a low bias the flow of ion current is negligible, which allows the device 10 to hold its resistance state.

Non-limiting examples of suitable materials for the active region 20 include oxides, sulfides, selenides, nitrides, phosphides, arsenides, chlorides, iodides, and bromides of silicon, transition metals, rare earth metals, or alkaline earth metals. It is to be understood, however, that there is a wide range of materials that exhibit the desired combination of properties: electronically semiconducting or insulating and Weak ionic conductor to enable the mobile dopants to be injected by drift into and ejected out of the active region 20.

In general, any semiconducting material (making up active region 20) that is also a weak ionic conductor with respect to the mobile dopant that can electrically dope the semiconductor will work in the embodiments disclosed herein. In other words, possible switch Compounds for the active-region 20 are semiconducting compounds with significant ionic contribution to the bonding. In a non-limiting example, the active region 20 is a material that is undoped and stoichiometric, and the mobile dopant is a large concentration of anion or cation vacancies contained in a layer of the same or another material.

As, previously Mentioned, in one embodiment, the material for the active region 20 is selected from oxides, sulfides, selenides, nitrides, phosphides, arsenides, chlorides, iodides, and bromides of the transition and rare earth Metals, with the alkaline earth metals often being present in compounds. Further, there are the various alloys of like compounds with each other, which offer a wide range of compositions if they are mutually soluble in each other. There are also mixed compounds, in which there are two, three or more different metal atoms combined with some number of the electronegative elements. In such instances, the mobile dopants formed may be anion vacancies or different valent elements.

Materials for the active region 20 including the elements Ti, Zr and Hf are particularly attractive because they may be compatible with Si integrated circuit technology. The primary oxidation state of all three metals is +4, the same as Si. As such, these elements would not create unintentional doping of the Si. Oxides of these elements are also known as titania, zirconia, and hafnia, respectively, and also by other names specific to the various polytypes of each Still another embodiment includes the alloys of these three oxides in pairs or with all three present simultaneously (e.g., $Ti_xZr_yHf_zO_2$, where x+y+z=1). Related sets of compounds include the titanates, zirconates and hafnates, which are represented by the specific example $SrTiO_3$, where Sr is the divalent element strontium. There is a wide variety of such compounds in which Ca, Ba, and other divalent elements (e.g., Mg, Zn, Cd) may be substituted for Sr, and Zr and Hf substituted for Ti. These compounds may be represented as $ABO_3$ compounds, where A is at least one divalent element and B is at least one of Ti, Zr, and Hf, and may have the perovskite structure.

It is also possible to utilize alloys of these various compounds, such as $Ca_aSr_bBa_cTi_xZr_yHf_zO_3$, where a+b+c=1 and x+y+z=1. There is also a wide variety of other oxides of the transition and rare earth metals with different valencies that may be used, both individually and as more complex compounds. In each case, the mobile dopants may be an oxygen vacancy or an aliovalent (e.g., different valence) element.

Yet another embodiment of compounds suitable for the active region 20 includes the sulfides and selenides of the transition metals with some ionic bonding character, essentially the S and Se analogues of the oxides mentioned above. Still another embodiment of compounds suitable for the active region 20 includes the semiconducting nitrides, such as AlN, GaN, ScN, YN, LaN, rare earth nitrides, and alloys of these compounds and more complex mixed metal nitrides. A still further embodiment of compounds suitable for the active region 22 includes the semiconducting halides (such as CuCl, CuBr, and AgCl), or the phosphides and arsenides of various transition and rare earth metals, e.g., Sc, Y, La, etc. In each of the examples set forth in this paragraph, either anion vacancies or aliovalent elements may be formed as the mobile dopants.

It is to be further understood that the active region 20 may include sublayers of different materials or compounds chosen from the examples above.

Suitable deposition techniques for the active region 20 include conventional physical and chemical techniques, including electron-beam evaporation, evaporation from a Knudsen cell, filament, or crucible, sputtering from a target, chemical vapor deposition (CVD), molecular beam deposition, atomic layer deposition, or various other forms of chemical vapor or beam growth from elements, compounds, or reactive precursors. Appropriate deposition or growth conditions, such as speed and temperature, may be selected to achieve the desirable chemical composition and local atomic structure desired for the active region 20.

When the pattern is formed in the substrate 12, 12', the active region 20 may also have grain boundaries GB formed therein and/or surface asperities SA formed thereon.

Formation of grain boundaries GB and/or surface asperities SA (in and/or on the electrode 18 and/or the active region 20) depends on the patterned surface (and its period in relation to the width of the material deposited thereon), the deposition technique, and the materials (of the electrode 18 and active, region 20) deposited and their phase and structure. As a non-limiting example, physical vapor deposition (e.g., evaporation) of an electrode 18 onto a substrate 12 at room temperature may tend to form a structure that accentuates the underlying surface relief (i.e., pattern). For example, shadowing during evaporation can lead to discontinuities in the deposited material at the base of irregularities/steps in the pattern. In this example, the electrode material may or may not become continuous as it thickens during continued deposition. If the material becomes continuous, a grain boundary GB is likely to occur. Furthermore, if the underlying substrate pattern is very fine, the irregularities may merge to form an asperity at the surface of the electrode 18.

Both physical vapor deposition and chemical vapor deposition may be useful to form either grain boundaries GB or surface asperities SA or both grain boundaries GB and surface asperities SA. For example, if the underlying material (e.g., the electrode 18) is polycrystalline and the depositing material (e.g., the active region 20) is not amorphous, the depositing material is likely to be polycrystalline and consequently have grain boundaries GB formed therein and surface asperities SA formed thereon. However, if the underlying material (e.g., substrate 12) is amorphous and the depositing material (e.g., electrode 18 or active region 20) is not amorphous, individual grains nucleated at random locations or near defects or contamination on the amorphous surface will have random orientation with respect to other grains. When two grains grow together during continued deposition, a grain boundary GB will usually form.

In other instances, the surface of the deposited material becomes smoother, rather than rougher, during chemical vapor deposition. As such, the formation of surface asperities depends further, at least in part, on the deposition regime (e.g., a surface reaction rate limited regime generally favors a conformal or rough surface], while a mass transport limited regime generally favors a smooth surface.

If a crystalline structure forms during deposition (or subsequent to deposition while the surface remains atomically clean to allow surface migration), the crystalline structure formed may be rough (i.e., have asperities). Furthermore, if the surface atoms can migrate during, a time period after deposition (for example, during annealing at an elevated temperature before a surface oxide or contamination forms on the surface to block surface diffusion), asperities can form. For example, amorphous silicon may be deposited as an electrode 18 for the electronic devices 10. During continued deposition or after deposition of the electrode 18 (while the surface remains clean to allow surface diffusion), the amorphous silicon crystallizes to form polycrystalline silicon (thereby creating grain boundaries GB), and the surface atoms migrate to form an extremely rough surface. This rough surface can lead to significant field concentration in, an overlying layer (e.g., the active region 20) during device operation.

The resulting, high fields may be beneficial or detrimental to device 10 performance depending, at least in part, on the mechanisms of device operation. In the embodiments disclosed herein, the surface asperities SA and grain boundaries GB are beneficial in either or both providing paths for dopant diffusion and increasing the local electric field to enhance device switching.

It is to be understood that in the embodiment shown in FIGS. 2A through 2F, any combination of grain boundaries GB and/or surface asperities SA formed in/on the electrode 18 and/or the active region 20 is possible. For example, the pattern, deposition techniques, and materials selected may result in the formation of grain boundaries GB and surface asperities SA in and on the electrode 18, but not in or on the active region 20. For another example, the pattern, deposition techniques, and materials selected may result in the formation of grain boundaries GB in the electrode 18 and active region 20 and no surface asperities SA.

In this embodiment, the top electrode 22 is then established on the active region 20. The top electrode 22 may be the same or a different material than the bottom electrode 18, and may be established via the same or a different technique than that used to establish the bottom electrode 18. In one example, the top electrode 22 is evaporated with an electron beam evaporator. The thickness of the top electrode 22 also generally ranges from about 5 nanometers to as many as hundreds of nanometers.

While the embodiment shown in FIG. 2F illustrates the pattern formed in the substrate 12, 12', it is to be understood that the desirable pattern may be formed in the electrode 18. An example of this method is shown and discussed in reference to FIGS. 3A through 3F, where one embodiment of the resulting device 10' is depicted in FIG. 3F. It is to be understood that the materials and techniques described in reference to the FIG. 2 series may be utilized for the embodiment disclosed in the FIG. 3 series.

As shown in FIGS. 3A and 3B, the substrate 12 has the electrode 18 established thereon. It is to be understood that while the adhesion layer 16 is not shown in this embodiment, the adhesion layer 16 may be established between the substrate 12 and the electrode 18.

The mask material 14 is established on the electrode 18, as depicted in FIG. 3C, in a manner sufficient to achieve a desirable pattern. Any of the mask materials 14, and techniques for establishing such mask materials 14 in predetermined patterns, may be used in this embodiment. The mask material 14 is established so that portions of the electrode 18 that are to be subsequently etched remain exposed.

Once the mask material 14 is established on the electrode 18 in the desirable pattern, the structure is exposed to an etching process. The exposed electrode 18 surfaces are etched, while the mask material 14 remains substantially intact, or intact enough such that the electrode 18 underlying the mask material 14 remains substantially unetched. Etching may be accomplished for a predetermined time so that a portion of the thickness of the exposed regions of the electrode 18 is etched away and the desirable pattern is formed in the electrode 18. As shown in FIG. 3E, the mask material 14 is removed to reveal the patterned electrode 18' established on the substrate 12.

In this embodiment, the rough surface of the pattern makes up the surface irregularities (which are included within the category of surface asperities) on the patterned electrode 18'. It is to be understood that when the pattern is formed in the electrode 18', control over the grain boundaries GB in the electrode 18' may not be accomplished.

The active region 20 is then established on the patterned electrode 18' (shown in FIG. 3F). When the pattern is formed in the electrode 18, 18', the active region 20 may have grain boundaries GB formed therein and/or surface asperities SA formed thereon. Such grain boundaries GB and/or surface asperities SA will depend, at least in part, on the patterned surface (and its period in relation to the width of the material deposited thereon), the deposition technique, and the materials (of the electrode 18 and active region 20) deposited and their phase and structure.

The top electrode 22 is established on the active region 20 to form the device 10', as shown in FIG. 3F.

Figure 4:
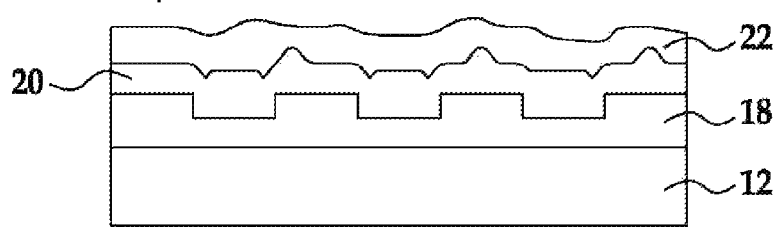
FIG. 4 is a schematic view of an embodiment of a device in which pattern is formed in a top electrode.

Still another embodiment of the device 10" is shown in FIG. 4. In this embodiment, the top surface of the active region 20 contains irregularities formed because of a pattern etched (i.e., directly defined) into the underlying electrode 18. In other instances, such irregularities may be formed in the top surface of the active region 20 as a result of a pattern directly defined in the active region 20 or into another underlying layer (e.g., substrate 12). In still other instances, such irregularities may be formed as a result of the deposition process of the active region 20 or an underlying layer, e.g., 18 or 12. The desirable irregularities on the bottom surface of the top electrode 22 are then formed by the deposition of the top electrode 22 replicating the irregularities on the top surface of the active region 20. The irregularities on the top surface of the active region 20 may also nucleate grain boundaries GB in the top electrode 22 by promoting nucleation of randomly oriented grains that form grain boundaries. GB when they grow together during continued deposition.

Figure 5:
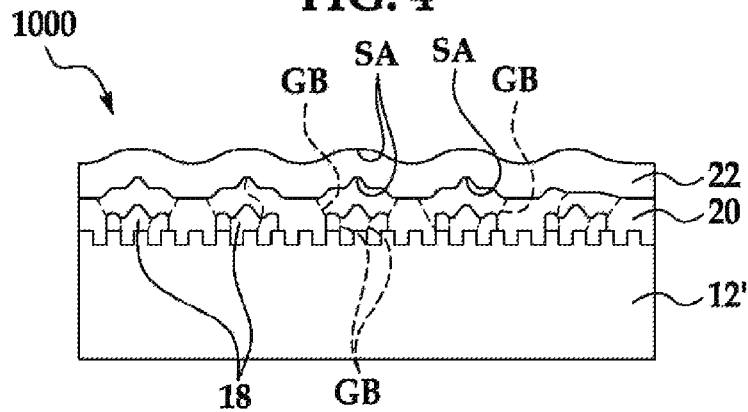
FIG. 5 is a cross-sectional view of an embodiment of an array including a plurality of devices.

It is to be understood that any of the devices 10, 10', 10" may be formed in an array (e.g., a cross-bar array similar to that shown in FIG. 1B). A cross-sectional view of a non-limiting example of such an array 1000 is shown in FIG. 5. The devices in the array 1000 are formed simultaneously on a single substrate (shown as patterned substrate 12'). While the pattern is shown, in this example, as, being defined in the substrate 12', it is to be understood that the pattern may also be defined in the multiple electrodes 18 substantially simultaneously, such that one or more features of the pattern are present in each of the resulting devices. This, in addition to the deposition techniques and materials (for subsequently deposited materials) selected, controls the uniformity of at least one of grain boundaries GB or surface asperities SA in the electrodes 18 and/or active regions 20 from one device in the array 1000 to the next. For improved uniformity of the characteristics of different devices, at least several (N) asperities SA or grain boundaries GB should be contained within each device to reduce the statistical difference ($\Delta N \propto \sqrt{N}$) between devices. It is to be understood that such an array 1000 may be a regular array of devices 10, 10', 10" or a non-regular array of devices 10, 10', 10".

The methods disclosed herein advantageously enable one to control the grain boundaries GB and/or surface asperities SA among several devices 10, 10', 10", thereby increasing the statistical reproducibility among devices 10, 10', 10". Furthermore, because the switching mechanisms are, believed to rely on grain boundaries GB and/or surface asperities SA, the methods disclosed herein advantageously enhance the device characteristics and their uniformity by increasing the electric field and/or diffusion paths in the electrodes 18, 22 within the resulting devices 10, 10', 10", and also enhance control over the diffusion paths and/or the surface irregularities.

While several embodiments have been described in detail, it will be apparent to those skilled in the art that the disclosed embodiments may be modified. Therefore, the foregoing description is to be considered exemplary rather than limiting.

What is claimed is:

1. An electrically, thermally, or electrically and thermally actuated device, comprising:
   a substrate;
   a first electrode established on the substrate;
   an active region established on the first electrode, the active region including mobile dopants therein, the mobile dopants being an ionic species that changes the electrical conductivity of the active region in response to an electric field;
   a second electrode established on the active region;
   a pattern formed into a surface of the substrate or the first electrode, the pattern having a period less than a width of the first electrode when formed into the surface of the substrate, or less than a width of the active region when formed into the surface of the first electrode; and grain boundaries formed within the first electrode when the pattern is formed into the surface of the substrate or formed within the active region when the pattern is formed into the surface of the first electrode, the grain boundaries having a density and a location controlled by the period of the pattern.

2. The device as defined in claim 1 wherein the substrate has the pattern directly formed into the surface thereof, wherein the first electrode has the grain boundaries therein, and wherein at least one of the first electrode, the active region, or the second electrode also has surface asperities on at least one surface thereof.

3. The device as defined in claim 1 wherein a wall of the pattern is at a 90° angle with respect to the surface of the substrate or first electrode.

4. The device as defined in claim 1 wherein the active region includes a material that is undoped and stoichiometric and wherein the ionic species is selected from the group consisting of anion vacancies and cation vacancies.

5. The device as defined in claim 1 wherein the active region is an oxide of a transition metal or a rare earth metal, and wherein the ionic species are oxygen vacancies.

6. The device as defined in claim 1 wherein the active region includes a compound represented by $ABO_3$, where A is at least one divalent element, B is at least one of Ti, Zr, and Hf, and wherein the ionic species are oxygen vacancies.

7. An electrically, thermally, or electrically and thermally actuated array, comprising:
   a plurality of the electrically, thermally, or electrically and thermally actuated devices of claim 1, wherein the substrates of each of the plurality of devices together form a single substrate upon which the electrodes and active region of each device are established, wherein the grain boundaries are substantially uniform from one device to another, and wherein each of the plurality of devices includes one or more features of the pattern.

8. An electrically, thermally, or electrically and thermally actuated device, comprising:
   an unpatterned substrate;
   a first electrode established on the unpatterned substrate;
   an active region established on the electrode;
   a second electrode established on the active region;
   a pattern directly formed into a surface of the first electrode, the pattern having a period less than a width of the active region; and
   grain boundaries formed in the active region and surface asperities formed on the active region, the grain boundaries having a density and a location controlled by the period of the pattern.

9. A method for controlling grain boundaries of one or more components of an electrically, thermally or electrically and thermally actuated device, the method comprising:
   establishing a first electrode on a substrate;
   establishing an active region on the first electrode, the active region including mobile dopants therein, the mobile dopants being an ionic species that changes the electrical conductivity of the active region in response to an electric field;
   establishing a second electrode on the active region; and
   directly forming a pattern into a surface of the substrate or in a surface of the first electrode, the pattern having a period less than a width of the first electrode when formed into the surface of the substrate or less than a width of an active region of the device when formed into the surface of the first electrode, the pattern facilitating the formation of predetermined grain boundaries in the subsequently formed first electrode when the pattern is formed into the surface of the substrate, or active region of the device when the pattern is formed into the surface of the first electrode, the predetermined grain boundaries having a density and a location controlled by the period of the pattern.

10. The method as defined in claim 9 wherein the pattern is directly defined in the substrate surface, and wherein directly defining the pattern is accomplished by:
    establishing a mask material on the substrate surface in a manner sufficient to achieve the pattern, whereby at least some of the substrate surface remains exposed;
    etching a portion of a thickness of the exposed substrate surface; and
    removing the mask material.

11. The method as defined in claim 10 wherein after the pattern is directly defined in the substrate surface, the method further comprises:
    the establishing of the first electrode on the substrate surface; and
    the establishing of the active region on the first electrode.

12. The method as defined in claim 10 wherein the mask material is selected from a self-assembled monolayer, a Langmuir-Blodgett film, or a block copolymer layer.

13. The method as defined in claim 9 wherein the first electrode is established on the substrate, wherein the pattern is directly defined in the surface of the first electrode, and wherein directly defining the pattern is accomplished by:
    establishing a mask material on the surface of the first electrode in a manner sufficient to achieve the pattern, whereby at least some of the first electrode surface remains exposed;
    etching a portion of a thickness of the exposed first electrode surface; and
    removing the mask material.

14. The method as defined in claim 13 wherein after the pattern is directly defined in the first electrode surface, and the method further comprises the establishing of the active region on the patterned first electrode surface.

15. The method as defined in claim 13 wherein etching the pattern controls surface asperities on the first or second electrode.

16. The method as defined in claim 9, further comprising:
    directly forming the pattern into a surface of a substrate of at least one other device or into a surface of a first electrode of the at least one other device simultaneously with directly forming the pattern into the substrate surface of the device or into the first electrode surface of the device such that each of the device and the at least one other device include one or more features of the pattern, thereby controlling, among devices, uniformity of grain boundaries in the electrodes or active regions of the devices.

* * * * *